(12) United States Patent
Hachiyanagi et al.

(10) Patent No.: US 8,735,997 B2
(45) Date of Patent: *May 27, 2014

(54) SEMICONDUCTOR DEVICE HAVING DRAIN/SOURCE SURROUNDED BY IMPURITY LAYER AND MANUFACTURING METHOD THEREOF

(75) Inventors: Toshihiro Hachiyanagi, Gunma (JP); Masafumi Uehara, Gunma (JP); Katsuyoshi Anzai, Gunma (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 458 days.

This patent is subject to a terminal disclaimer.

(21) Appl. No.: 11/856,481

(22) Filed: Sep. 17, 2007

(65) Prior Publication Data

US 2008/0067617 A1     Mar. 20, 2008

(30) Foreign Application Priority Data

Sep. 15, 2006   (JP) ................................. 2006-251079

(51) Int. Cl.
 *H01L 29/66* (2006.01)
(52) U.S. Cl.
 USPC ........... 257/409; 257/328; 257/335; 257/336; 257/355; 257/408; 257/E29.014; 257/E29.023; 257/E29.027; 257/E29.066; 257/E29.256
(58) Field of Classification Search
 USPC .......... 257/409, 355, E29.014, E29.023, 328, 257/E29.027, E29.066, E29.256, 335, 336, 257/408
 See application file for complete search history.

(56) References Cited

U.S. PATENT DOCUMENTS

| 4,811,075 A | 3/1989 | Eklund |
| 5,072,268 A | 12/1991 | Rumennik |
| 5,932,897 A * | 8/1999 | Kawaguchi et al. .......... 257/141 |
| 6,144,070 A * | 11/2000 | Devore et al. ................. 257/343 |
| 6,172,400 B1 * | 1/2001 | Ng et al. ........................ 257/343 |
| 6,538,281 B2 * | 3/2003 | Croce et al. ................... 257/335 |
| 6,614,077 B2 | 9/2003 | Nakamura et al. |
| 6,927,453 B2 | 8/2005 | Shibib et al. |
| 7,297,606 B2 | 11/2007 | Shibib et al. |
| 7,868,385 B2 | 1/2011 | Ichikawa |
| 8,298,898 B2 | 10/2012 | Ichikawa |
| 2002/0093065 A1 * | 7/2002 | Kikuchi et al. ............... 257/409 |
| 2004/0150041 A1 * | 8/2004 | Watanabe et al. ............. 257/343 |

(Continued)

FOREIGN PATENT DOCUMENTS

| JP | 63-314869 | 12/1988 |
| JP | 6-52791 | 7/1994 |

(Continued)

*Primary Examiner* — Anthony Ho
*Assistant Examiner* — David Chen

(57) ABSTRACT

A transistor structure that improves ESD withstand voltages is offered. A high impurity concentration drain layer is formed in a surface of an intermediate impurity concentration drain layer at a location separated from a drain-side end of a gate electrode. And a P-type impurity layer is formed in a surface of a substrate between the gate electrode and the high impurity concentration drain layer so as to surround the high impurity concentration drain layer. When a parasitic bipolar transistor is turned on by an abnormal surge, electrons travel from a source electrode to a drain electrode. Here, electrons travel dispersed in the manner to avoid a vicinity X of the surface of the substrate and travel through a deeper path to the drain electrode as indicated by arrows in FIG. 4.

9 Claims, 4 Drawing Sheets

(56) References Cited

U.S. PATENT DOCUMENTS

2005/0067655 A1* 3/2005 Shibib et al. ............... 257/344
2006/0043487 A1* 3/2006 Pauletti et al. ............. 257/355
2006/0081924 A1* 4/2006 Ichikawa .................... 257/340
2006/0186467 A1* 8/2006 Pendharkar et al. ........ 257/337
2006/0226499 A1* 10/2006 Shimizu ...................... 257/409

FOREIGN PATENT DOCUMENTS

| JP | 2001-320047 | 11/2001 |
| JP | 2002-43579 | 2/2002 |
| JP | 2002-134738 | 5/2002 |
| JP | 2005-109483 | 4/2005 |
| JP | 2006-114768 | 4/2006 |

* cited by examiner

SEMICONDUCTOR DEVICE HAVING DRAIN/SOURCE SURROUNDED BY IMPURITY LAYER AND MANUFACTURING METHOD THEREOF

CROSS-REFERENCE OF THE INVENTION

This application claims priority from Japanese Patent Application No. 2006-251079, the content of which is incorporated herein by reference in its entirety.

BACKGROUND OF THE INVENTION

1. Field of the Invention

This invention relates to a semiconductor device and its manufacturing method, specifically to a high withstand voltage MOS transistor and its manufacturing method.

2. Description of the Related Art

The high withstand voltage MOS transistor has a high source-drain withstand voltage (BVDS) or a high gate withstand voltage, and is used in various kinds of drivers such as an LCD driver and an EL driver, power supply circuits and the like.

FIG. 6 is a cross-sectional view showing a structure of an N-channel type high withstand voltage MOS transistor according to a conventional art. A gate insulation film 101 and a thick field insulation film 102 are formed on a surface of a P-type semiconductor substrate 100. A gate electrode 103 is formed on the gate insulation film 101 and on an adjacent portion of the field insulation film 102. In the surface of the semiconductor substrate 100, there are formed a high impurity concentration (N++ type) source layer 104 and a low impurity concentration source layer 105 adjacent one end of the gate electrode 103.

A high impurity concentration (N++ type) drain layer 106 is formed in the surface of the semiconductor substrate 100 separated from the other end of the gate electrode 103. A low impurity concentration (N− type) drain layer 107 that is lower in impurity concentration and deeper in diffusion depth than the high impurity concentration drain layer 106 is formed in a region extending from beneath the gate electrode 103 to beneath the field insulation film 102 and the high impurity concentration drain layer 106. The high impurity concentration drain layer 106 is formed in the low impurity concentration drain layer 107. The source region and the drain region are made of a so-called LDD (Lightly Doped Drain) structure that is composed of a high impurity concentration portion and a low impurity concentration portion, as described above. A sidewall spacer film 108 made of a silicon nitride film or the like is formed on a sidewall of the gate electrode 103.

The conventional high withstand voltage MOS transistor described above obtains the high source-drain withstand voltage because a drain electric field is eased by extending a depletion layer into the low impurity concentration drain layer 107 when a high voltage is applied to the high impurity concentration drain layer 106. Also, it has a structure sturdy against breakdown of the gate insulation film 103, because the gate electrode 103 extends from the gate insulation film 101 to the adjacent portion of the field insulation film 102.

Technologies described above are disclosed in Japanese Patent Application Publication No. 2002-134738.

However, there has been a problem that the conventional transistor structure described above does not have enough withstand voltage against electrostatic discharge (hereafter referred to as ESD withstand voltage). For example, according to typical electrostatic discharge tests performed by the inventors, the ESD withstand voltage based on a human body model (HBM) is less than 200 volts and the ESD withstand voltage based on a machine model (MM) is less than 50 volts, which are not high enough. Therefore, this invention is directed to a transistor structure that improves the ESD withstand voltages.

SUMMARY OF THE INVENTION

Primary features of this invention are described below. This invention offers a semiconductor device having a gate insulation film formed on a surface of a semiconductor layer of a first conductivity type, a gate electrode formed on the gate insulation film, a source layer of a second conductivity type formed in the surface of the semiconductor substrate, a high impurity concentration drain layer of the second conductivity type formed in the surface of the semiconductor layer being separated from a drain-side end of the gate electrode, and an impurity layer of the first conductivity type formed in the surface of the semiconductor layer between the gate electrode and the high impurity concentration drain layer and adjacent the high impurity concentration drain layer.

This invention also offers a method of manufacturing a semiconductor device including forming a gate insulation film on a surface of a semiconductor layer of a first conductivity type, forming a gate electrode on the gate insulation film, forming a high impurity concentration drain layer of a second conductivity type in the surface of the semiconductor layer separated from the gate electrode, and forming an impurity layer of the first conductivity type in the surface of the semiconductor layer adjacent the high impurity concentration drain layer.

DETAILED DESCRIPTION OF THE INVENTION

Figure 1:
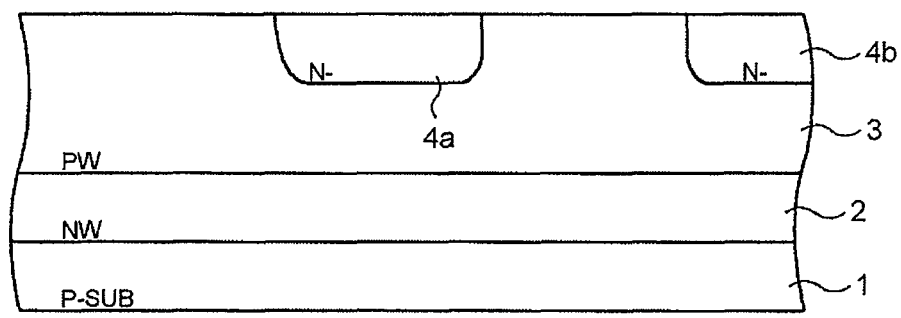
FIG. 1 is a cross-sectional view showing a semiconductor device and its manufacturing method according an embodiment of this invention.

A semiconductor device according to an embodiment of this invention will be described hereafter referring to the drawings. FIG. 1 through FIG. 4 are cross-sectional views showing the semiconductor device in the order of manufacturing process steps according to the embodiment of this invention.

First, N-type impurities are implanted into a surface of a P-type semiconductor substrate 1, followed by a thermal diffusion to form an N-type well layer (NW) 2, as shown in FIG. 1. In the implantation process, phosphorus ions $^{31}P^+$ are implanted at a dose of $1.0 \times 10^{13}/cm^2$ and an acceleration energy of 80 KeV, for example. Forming the N-type well (NW) is not necessarily required and may be omitted.

Next, a P-type well layer (PW) 3 is formed by implanting P-type impurities into a surface of the well layer 2 followed by thermal diffusion. In the implantation process, boron ions $^{11}B^+$ are implanted at a dose of $2.3 \times 10^{13}$/cm$^2$ and an acceleration energy of 80 KeV, for example.

It is noted that conductivity types such as N++, N+, N and N− belong in one general conductivity type, and conductivity types such as P++, P+, P and P− belong in another general conductivity type.

Next, low impurity concentration (N− type) drain layers 4a and 4b are formed by selectively implanting N-type impurities into a surface of the well layer 3. The low impurity concentration drain layers 4a and 4b are separated from each other. That is, the ion implantation is performed using a predetermined mask so that the ions are not implanted into a region between the drain layers 4a and 4b. In the implantation process, phosphorus ions $^{31}P^+$ are implanted at a dose of $1.5 \times 10^{13}$/cm$^2$ and an acceleration energy of 100 KeV, for example.

Figure 2:
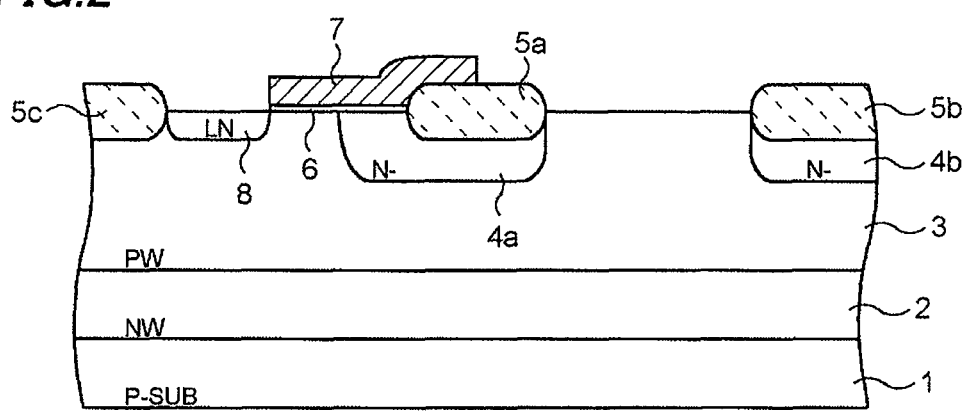
FIG. 2 is a cross-sectional view showing the semiconductor device and its manufacturing method according the embodiment of this invention.

Next, thick field insulation films 5a, 5b and 5c are formed on predetermined regions of the well layer 3 using a LOCOS (Local Oxidation of Silicon) method, as shown in FIG. 2. Each of the field insulation films 5a and 5b is formed on the region overlapping each of the low impurity concentration drain layers 4a and 4b, respectively. While a field insulation film is formed usually for device isolation, the field insulation films 5a, 5b and 5c in this semiconductor device are used for enhancing a withstand voltage of a transistor. A thickness of the field insulation films 5a, 5b and 5c varies depending on a target withstand voltage, and is about 300-600 nm, for example. Note that the forming of the field insulation film is not limited to the LOCOS method, and other device isolation methods including an STI (Shallow Trench Isolation) method, for example, may be used.

Next, a gate insulation film 6 is formed by a thermal oxidation method, for example. A thickness of the gate insulation film varies depending on the target withstand voltage, and is about 15-200 nm, for example. The field insulation films 5a, 5b and 5c are thicker than the gate insulation film 6.

Next, a polysilicon layer is formed as a conductive material over the entire surface of the semiconductor substrate 1 by a CVD (Chemical Vapor Deposition) method, for example. After that, a gate electrode 7 is formed by selectively removing the polysilicon layer and the gate insulation film 6. The gate electrode 7 is patterned to cover the gate insulation film 6 and extend onto an adjacent portion of the field insulation film 5a. The withstand voltage is enhanced with this. Its thickness is about 300 nm, for example. Resistance of the gate electrode 7 is reduced as required by implanting and diffusing impurities such as phosphorus ions.

Next, a low impurity concentration source layer (LN) 8 is formed by implanting N-type impurities into a surface region of the well layer 3 on the left side of the gate electrode 7 using the gate electrode 7 as a part of a mask. In the implantation process, phosphorus ions $^{31}P^+$ are implanted at a dose of $4.2 \times 10^{13}$/cm$^2$ and an acceleration energy of 20 KeV, for example. The low impurity concentration source layer 8 may be formed after forming sidewall spacer films 9a and 9b, which will be described later.

Figure 3A:
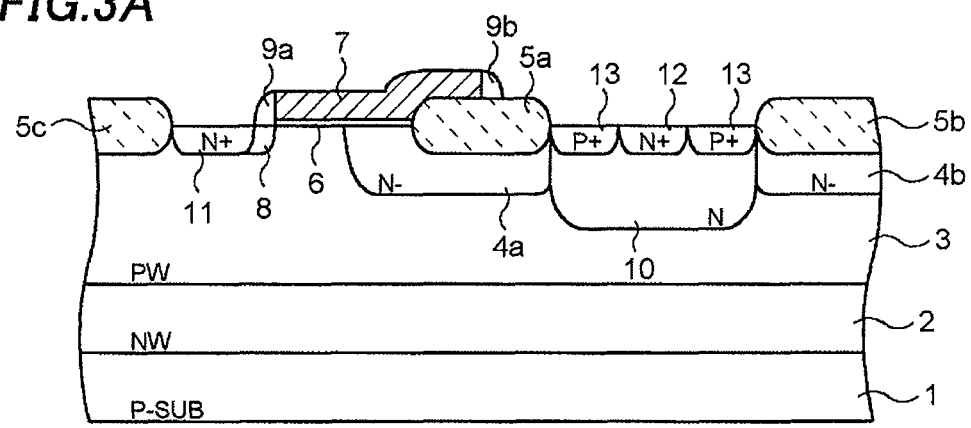
FIGS. 3A and 3B are a cross-sectional view and a plan view, respectively, showing the semiconductor device and its manufacturing method according the embodiment of this invention.

Next, a silicon nitride film or a silicon oxide film (TEOS (Tetra-Ethyl Ortho-Silicate) film, for example) is formed over the entire surface of the semiconductor substrate 1 by the CVD method, for example, and then the sidewall spacer films 9a and 9b that surround the gate electrode 7 are formed by etching back the silicon nitride film or the silicon oxide film, as shown in FIG. 3A. In the case where the sidewall spacer films 9a and 9b are made of conductive material such as polysilicon, both the gate electrode 7 and the sidewall spacer films 9a and 9b make the gate electrode.

Next, an intermediate impurity concentration drain layer (N) 10, that is higher in impurity concentration and deeper in implant depth of the impurities than the low impurity concentration drain layers 4a and 4b, is formed by implanting N-type impurities into a surface region of the well layer 3 surrounded by the field insulation films 5a and 5b using a photoresist layer (not shown) and the field insulation films 5a and 5b as a mask. The intermediate impurity concentration drain layer 10 is adjacent the low impurity concentration drain layers 4a and 4b. In the implantation process, phosphorus ions $^{31}P^+$ are implanted at a dose of $8.0 \times 10^{13}$/cm$^2$ and an acceleration energy of 1000 KeV, for example. The intermediate impurity concentration drain layer 10 and the low impurity concentration drain layers 4a and 4b may be separated or may be overlapped.

Figure 3B:
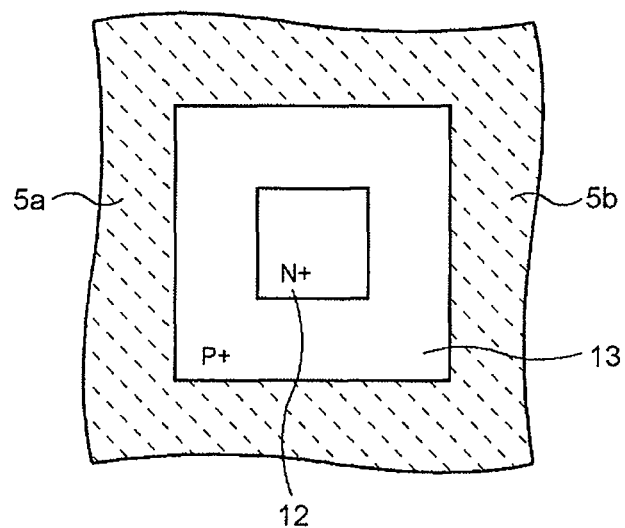

Next, a high impurity concentration drain layer (N+) 12 is formed in a region overlapping the intermediate impurity concentration drain layer 10, while a high impurity concentration source layer (N+) 11 is formed in a region overlapping the low impurity concentration source layer 8 by implanting N-type impurities using a photoresist layer (not shown) and the sidewall spacer film 9a as a mask. In the implantation process, arsenic ions $^{75}As^+$ are implanted at a dose of $5.0 \times 10^{13}$/cm$^2$ and an acceleration energy of 100 KeV, for example. The high impurity concentration drain layer 12 is formed not in the entire surface of the intermediate impurity concentration drain layer 10, but is formed in a region separated from the field insulation films 5a and 5b and in the vicinity of a region where a drain electrode, that will be described later, is to be formed, as shown in FIGS. 3A and 3B. FIG. 3B is a partial plan view showing the regions where the field insulation films 5a and 5b and the high impurity concentration drain layer 12 are formed.

Next, a high concentration P-type impurity layer 13 is formed by implanting P-type impurities into the intermediate impurity concentration drain layer 10 using a photoresist layer (not shown) as a mask. The P-type impurity layer 13 contributes to enhancement of the ESD withstand voltage. This point will be described later. In the implantation process, boron difluoride ions $^{49}BF_2^+$ are implanted at a dose of $2.0 \times 10^{15}$/cm$^2$ and an acceleration energy of 40 KeV, for example. The P-type impurity layer 13 in this embodiment surrounds the high impurity concentration drain layer 12 in a ring shape and is adjacent the high impurity concentration drain layer 12, as shown in FIG. 3B. From the standpoint of enhancing the ESD withstand voltage, it is considered to be favorable that the P-type impurity layer 13 is formed deeper than the high impurity concentration drain layer 12. Although it is considered to be favorable from the standpoint of enhancing the ESD withstand voltage that the P-type impurity layer 13 is adjacent the high impurity concentration drain layer 12 as shown in FIGS. 3A and 3B, they may be separated from each other. Also, the P-type impurity layer 13 is adjacent the field insulation films 5a and 5b in this embodiment. Annealing is performed next.

The high impurity concentration drain layer 12 and the P-type impurity layer 13 may be formed by implanting ions to form the high impurity concentration drain layer 12 into the entire surface region of the intermediate impurity concentration drain layer 10 and then implanting ions to form the P-type impurity layer 13 into the corresponding regions that partially overlap the surface region of the intermediate impurity concentration drain layer 10.

Figure 4:
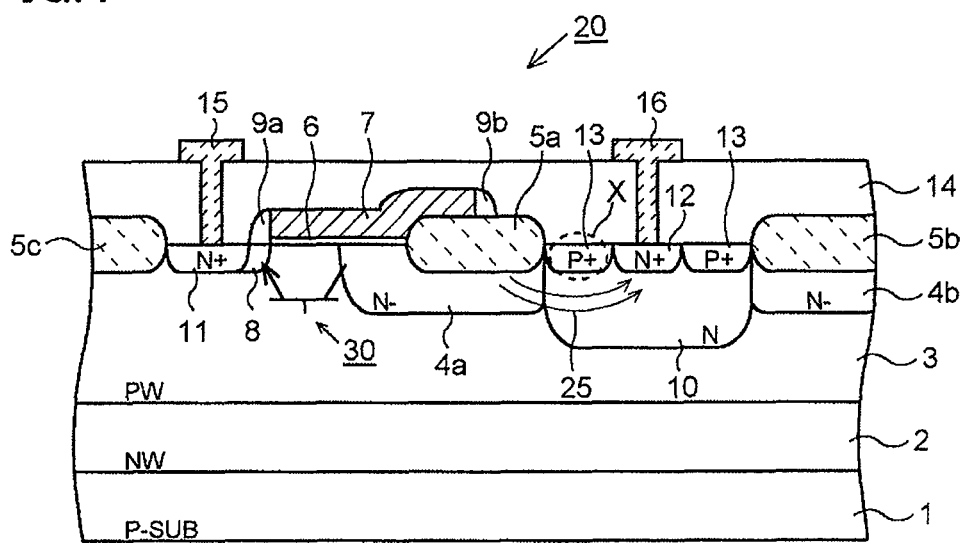
FIG. 4 is a cross-sectional view showing the semiconductor device and its manufacturing method according the embodiment of this invention.

Next, an interlayer insulation film 14, such as a BPSG (Boro-Phospho Silicate Glass) film or a silicon nitride film formed by the CVD method, is formed over the entire semiconductor substrate 1, as shown in FIG. 4. Then a contact hole reaching to the high impurity concentration source layer 11 and a contact hole reaching to the high impurity concentration drain layer 12 are formed, and a source electrode 15 and a drain electrode 16 are formed each at a corresponding each of the contact holes, respectively.

The semiconductor device 20 according to the embodiment is obtained through the manufacturing process described above. When an excessive positive surge voltage is caused at the drain electrode 16 of the semiconductor device 20 completed as described above, a parasitic NPN bipolar transistor 30 is turned on and an electric current flows from a side of the drain electrode 16 to a side of the source electrode 15. This parasitic bipolar action is a phenomenon in which the parasitic bipolar transistor 30 is turned on by a base current from the well layer 3 to the source layers 8 and 11 when a breakdown of a junction between the drain layer 4a and the well layer 3 induces an electric current in the well layer 3 to raise a voltage at the well layer 3.

Figure 6:
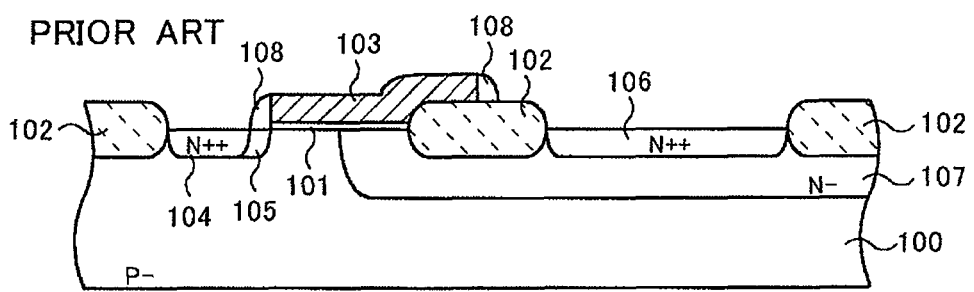
FIG. 6 is a cross-sectional view showing a conventional semiconductor device.

During the parasitic bipolar action, electrons move from the side of the source electrode 15 to the side of the drain electrode 16. In the conventional structure in which no P-type impurity layer 13 is formed (Refer to FIG. 6.), electrons flow concentrated in the vicinity of the surface of the substrate, generating heat which eventually leads to destruction. On the other hand, there is formed the P-type impurity layer 13 in the structure according to the embodiment. As a result, electrons are considered to flow dispersed avoiding the vicinity X of the surface of the substrate where the P-type impurity layer 13 is formed and travel in a detouring manner through deeper path to the drain electrode 16 as indicated by arrows 25 in FIG. 4. That is, it seems that the electrons (=electric current) flow dispersed and deeper from the surface of the substrate by the effect of the P-type impurity layer 13, dispersing heat generation and making ESD destruction less likely to occur as a result.

The inventors conducted ESD tests and confirmed improvements in the ESD withstand voltages. To be more specific, the ESD withstand voltage based on the human body model, which had been less than 200 volts with the conventional structure, was improved to about 3000-3500 volts with the structure according to the embodiment, while the ESD withstand voltage based on the machine model, which had been less that 50 volts with the conventional structure, was improved to about 400 volts with the structure according to the embodiment. ESD tests were also conducted on a semiconductor device that had the same structure as the semiconductor device according to the embodiment except for that the P-type impurity layer 13 was not formed. The ESD tests showed that the ESD withstand voltage based on the human body model was 2000-2250 volts, while the ESD withstand voltage based on the machine model was 200-220 volts. It is concluded from the tests that the structure according to the embodiment dramatically improve the ESD withstand voltage compared with the conventional structure and that the P-type impurity layer 13 significantly contributes to the improvement in the ESD withstand voltages.

Figure 5A:
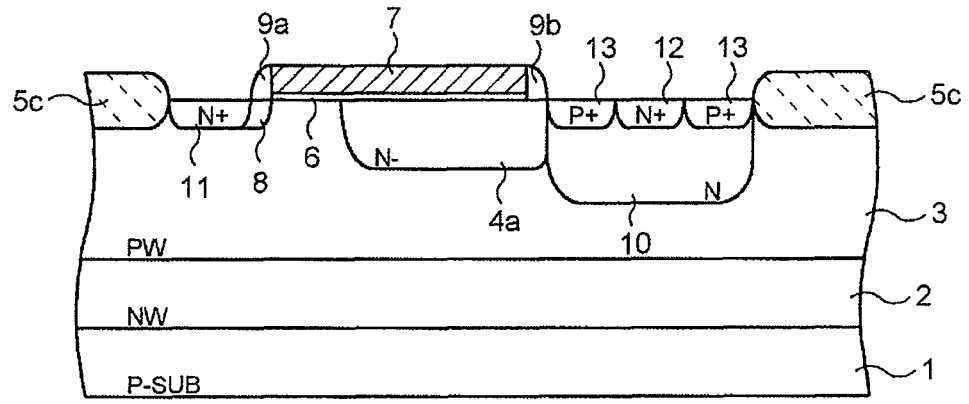
FIGS. 5A and 5B are cross-sectional views showing semiconductor devices according to modifications of the embodiment of this invention.

It is apparent that this invention is not limited to the embodiments described above and may be modified within the scope of the invention. For example, the low impurity concentration drain layers 4a and 4b shown in the cross-sectional views have a separating portion between them. However, the low impurity concentration drain regions may be formed contiguously without separation. The ESD withstand voltages may be further improved by disposing another P-type impurity layer below the field insulation film 5a. Although there is formed the field insulation film 5a under a portion of the gate electrode 7, it is possible to change the design of the structure so that the field insulation film 5a is not formed, as shown in FIG. 5A.

Figure 5B:
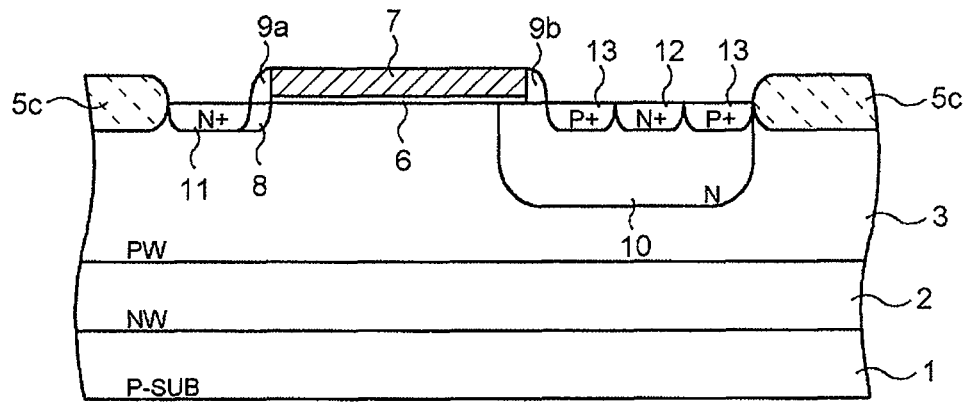

It is also possible to change the design so that the source-side end of the intermediate impurity concentration drain layer 10 is located under the gate electrode 7 or the sidewall spacer film 9b and the low impurity concentration drain layer 4a is not formed, as shown in FIG. 5B.

It is also possible to change the order of the manufacturing process steps or the processing conditions. For example, the intermediate impurity concentration drain layer 10, which is formed after forming the sidewall spacer films 9a and 9b in the embodiment described above, may be formed before forming the sidewall spacer films 9a and 9b. To be more specific, the intermediate impurity concentration drain layer 10 may be formed after forming the field insulation films 5a, 5b and 5c by implanting ions to form the intermediate impurity concentration drain layer 10 using a predetermined mask followed by thermal diffusion of the implanted ions. Then, the gate insulation film 6 and the gate electrode 7 may be formed after that. Considering that the intermediate impurity concentration drain layer 10 is formed deep by the thermal diffusion, the ion implantation to form the intermediate impurity concentration drain layer 10 may be performed at not high acceleration energy by making the dose of implanting ions relatively high. Ion implantation conditions in this case are as follows. When arsenic ions $^{75}As^+$ are used, a dose of the ions is $1.0\times10^{15}$-$6.0\times10^{15}$/cm$^2$ and an acceleration energy is 50 KeV, and when phosphorus ions $^{31}P^+$ are used, a dose of the ions is $1.0\times10^{15}$-$6.0\times10^{15}$/cm$^2$ and an acceleration energy is 40-80 KeV, for example.

This invention may be applied to a P-channel type MOS transistor which has the same structure as the N-channel type MOS transistor described above with only difference in conductivity type, as well-known to those skilled in the art.

The impurity layer that is opposite to the drain layer in conductivity type is formed in the surface of the semiconductor layer between the gate electrode and the high impurity concentration drain layer and adjacent the high impurity concentration drain layer in the semiconductor device according to the embodiment of this invention. By structuring as described above, when an abnormal surge occurs, electrons travel in the manner to avoid the vicinity of the impurity layer through deeper path to the drain electrode. That is, movement of electrons in the vicinity of the surface of the semiconductor layer is suppressed. As a result, the ESD withstand voltages are improved.

What is claimed is:

1. A semiconductor device comprising:
a gate insulation film disposed on and physically in contact with a semiconductor layer of a first general conductivity type;
a gate electrode disposed on the gate insulation film;
a source layer of a second general conductivity type formed in a first surface portion of the semiconductor layer;
a high impurity concentration drain layer of the second general conductivity type formed in a second surface portion of the semiconductor layer so as to be separated from a drain-side end of the gate electrode;
an impurity layer of the first general conductivity type formed in a third surface portion of the semiconductor layer between the gate electrode and the high impurity concentration drain layer; and an intermediate impurity concentration drain layer formed in a fourth surface portion of the semiconductor layer so as to be disposed under the high impurity concentration drain layer and the impurity layer, the intermediate impurity concentration drain layer being lower in impurity concentration and deeper in depth than the high impurity concentration drain layer;

a drain electrode disposed on the high impurity concentration drain layer so as to be physically in contact with the high impurity concentration drain layer; and a low impurity concentration drain layer of the second general conductivity type formed in a fifth surface portion of the semiconductor layer so as to be under the gate electrode and adjacent the impurity layer, wherein the impurity layer is physically in contact with the intermediate impurity concentration drain layer, the semiconductor layer is physically in contact with the intermediate impurity concentration drain layer, the impurity layer is not physically in contact with the drain electrode, the low impurity concentration drain layer is lower in impurity concentration and deeper in depth than the high impurity concentration drain layer and is lower in impurity concentration and shallower in depth than the intermediate impurity concentration drain layer, and the impurity layer does not extend underneath the gate electrode.

2. The semiconductor device of claim 1, further comprising a thick insulation film that is thicker than the gate insulation film and disposed on the semiconductor layer, wherein the gate electrode extends over a portion of the thick insulation film.

3. The semiconductor device of claim 2, wherein the impurity layer is in contact with a drain-side end of the thick insulation film.

4. The semiconductor device of claim 1, wherein the semiconductor layer is physically in contact with the source layer.

5. A method of manufacturing a semiconductor device, comprising:
forming a gate insulation film on a semiconductor layer of a first general conductivity type so as to be physically in contact with the semiconductor layer;
forming a gate electrode on the gate insulation film;
forming a high impurity concentration drain layer of a second general conductivity type in the semiconductor layer so as to be separated from the gate electrode;
forming an impurity layer of the first general conductivity type in the semiconductor layer between the gate electrode and the high impurity concentration drain layer so that the impurity layer does not extend underneath the gate electrode; and
forming an intermediate impurity concentration drain layer in the semiconductor layer so that the intermediate impurity concentration drain layer is physically in contact with the impurity layer and the semiconductor layer, is disposed under the high impurity concentration drain layer and the impurity layer, and is deeper in depth and lower in impurity concentration than the high impurity concentration drain layer;
forming a drain electrode on the high impurity concentration drain layer so as to be physically in contact with the high impurity concentration drain layer; and
forming a low impurity concentration drain layer in the semiconductor layer so that the low impurity concentration drain layer is positioned under the gate electrode and adjacent the impurity layer, is lower in impurity concentration and deeper in depth than the high impurity concentration drain layer, and is lower in impurity concentration and shallower in depth than the intermediate impurity concentration drain layer, wherein the impurity layer is formed so as not to be physically in contact with the drain electrode.

6. The method of claim 5, further comprising forming a thick insulation film on the low impurity concentration drain layer, the thick insulation film being thicker than the gate insulation film, wherein the forming of the impurity layer is performed so that the impurity layer is in contact with a drain-side end of the thick insulation film.

7. A semiconductor device comprising:
a semiconductor layer of a first general conductivity type;
a gate insulation film disposed on and physically in contact with the semiconductor layer;
a gate electrode disposed on the gate insulation film;
a source layer of a second general conductivity type formed in a surface portion of the semiconductor layer;
a drain layer of the second general conductivity type formed in a surface portion of the semiconductor layer;
a high impurity concentration drain layer of the second general conductivity type formed in a surface portion of the drain layer so as to be separated from a drain-side end of the gate electrode, the high impurity concentration drain layer having an impurity concentration higher than the drain layer;
an impurity layer of the first general conductivity type formed in a surface portion of the drain layer so as to surround the high impurity concentration drain layer in plan view of the semiconductor device;
a drain electrode physically in contact with the high impurity concentration drain layer; and
a source electrode in contact with the source layer, wherein the high impurity concentration drain layer comprises an outer boundary in the plan view, and only the high impurity concentration drain layer exists within the outer boundary in the plan view, the semiconductor layer is physically in contact with the drain layer, the impurity layer is not physically in contact with the drain electrode, the impurity layer does not extend underneath the gate electrode.

8. The semiconductor device of claim 7, wherein the impurity layer surrounds and physically contacts the outer boundary in the plan view of the high impurity concentration drain layer.

9. A semiconductor device comprising:
a gate insulation film disposed on and physically in contact with a semiconductor layer of a first general conductivity type;
a gate electrode disposed on the gate insulation film;
a source layer of a second general conductivity type formed in a first surface portion of the semiconductor layer;
a high impurity concentration drain layer of the second general conductivity type formed in a second surface portion of the semiconductor layer so as to be separated from a drain-side end of the gate electrode;
an impurity layer of the first general conductivity type formed in a third surface portion of the semiconductor layer between the gate electrode and the high impurity concentration drain layer; and
an intermediate impurity concentration drain layer formed in a fourth surface portion of the semiconductor layer so as to be disposed under the high impurity concentration drain layer and the impurity layer, the intermediate impurity concentration drain layer being lower in impurity concentration and deeper in depth than the high impurity concentration drain layer;
a drain electrode disposed on the high impurity concentration drain layer so as to be physically in contact with the high impurity concentration drain layer; and
a thick insulation film that is thicker than the gate insulation film and disposed on the semiconductor layer,
wherein the gate electrode extends over a portion of the thick insulation film,
the impurity layer is physically in contact with the intermediate impurity concentration drain layer,
the semiconductor layer is physically in contact with the intermediate impurity concentration drain layer,
the impurity layer is not physically in contact with the drain electrode, and
the impurity layer does not extend underneath the thick insulation film.

* * * * *